United States Patent [19]

Liu et al.

[11] 3,753,153

[45] Aug. 14, 1973

[54] DOUBLE PULSE BIAS STABILIZATION OF A MICROWAVE OSCILLATOR USING AN AVALANCHE DIODE OPERATIVE IN THE ANOMALOUS MODE

[75] Inventors: Shing-Gong Liu, Princeton; John Joseph, Cranbury, both of N.J.

[73] Assignee: The United States of America as represented by the United States Atomic Energy Commission

[22] Filed: Apr. 21, 1972

[21] Appl. No.: 246,470

[52] U.S. Cl. ............. 331/107 R, 331/96, 333/84 M
[51] Int. Cl. .............................................. H03b 7/14
[58] Field of Search ............................. 331/107, 96; 333/84 M

[56] References Cited

UNITED STATES PATENTS 3,588,735 6/1971 Chang ............................ 331/107 R

*Primary Examiner*—John Kominski
*Attorney*—Edward J. Norton

[57] ABSTRACT

The operation of a microwave oscillator using an avalanche diode operative in the anomalous mode is stabilized by the use of a double pulse, direct current bias signal. The double pulse bias signal first triggers the anomalous mode of diode operation with minimum oscillator instability and reduced oscillator output power, thereafter causing the anomalous mode of diode operation to continue without increasing the oscillator instability but increasing the oscillator output power.

6 Claims, 2 Drawing Figures

DOUBLE PULSE BIAS STABILIZATION OF A MICROWAVE OSCILLATOR USING AN AVALANCHE DIODE OPERATIVE IN THE ANOMALOUS MODE

The invention herein described was made in the course of or under a contract or subconract thereunder with the Atomic Energy Commission.

DESCRIPTION OF THE PRIOR ART

Microwave oscillators using avalanche diodes operative in the anomalous mode have been described in numerous technical publications and U.S. patents. A reverse bias signal exceeding a predetermined threshold level is applied to the electrodes of an avalanche diode. The diode is part of a microwave circuit designed to provide the necessary boundary conditions for the anomalous mode of avalanche diode operation. However, before the diode is triggered into its anomalous mode of operation by the reverse bias signal, there is a period of oscillator instability. The period of oscillator instability increases as e magnitude of the reverse bias signal is increased. For certain applications, the period of oscillator instability is a serious problem. A previous solution to this problem has been to tune the associated microwave circuitry for minimum oscillator instability. Such a solution is not always satisfactory, since the associated microwave circuitry may not now be tuned for maximum oscillator efficiency or performance.

SUMMARY OF THE INVENTION

An avalanche diode, operating in the anomalous mode, generates energy at a given frequency in response to a double pulse bias signal. The bias signal includes a first pulse portion of one magnitude followed by a second pulse portion of greater magnitude, the magnitudes of both pulse portions exceeding a given threshold value. The electrodes of the avalanche diode are coupled to a microwave circuit that is a resistive termination for signals at the given frequency and a reactive termination for signals at all other frequencies. The first pulse portion of the bias signal has a magntiude exceeding a predetermined threshold level at time $t_1$, whereby the diode is triggered into generating signals at the given frequency. The second pulse portion of the bias signal has a magnitude exceeding the magnitude of the first bias signal at a later time $t_2$, whereby the diode continues signal generation at increased output power.

BRIEF DESCRIPTION OF THE DRAWINGS

Referring to FIG. 1, a microwave oscillator including an avalanche diode, $D_1$, operative in the anomalous mode is shown. An avalanche diode is a two terminal negative resistance semiconductive device. A displacement current or electric field is created in the depletion layer of the semiconductive material when an appropriate reverse bias voltage is applied across the diode terminals. The magnitude of the reverse bias voltage is slightly greater than the breakdown voltage of the diode, $D_1$. As a result of the applied reverse bias voltage, diode carriers are ionized at the point of maximum electric field within the depletion layer. The carrier density is increased when the ionized carriers collide with other atoms and create more carriers. The displacement current can also be considered as a wavefront, moving with specific wave velocity, provided the displacement current has a very fast rise time. If the wave velocity of the displacement current is greater than the saturation velocity of the carriers, a high density of holes and electrons will be left in the wake of this wavefront. As a result of the concentration of holes and electrons, the electric field is reduced and the velocity of the carriers is diminished, leading to the formation of a dense trapped plasma.

Figure 1:
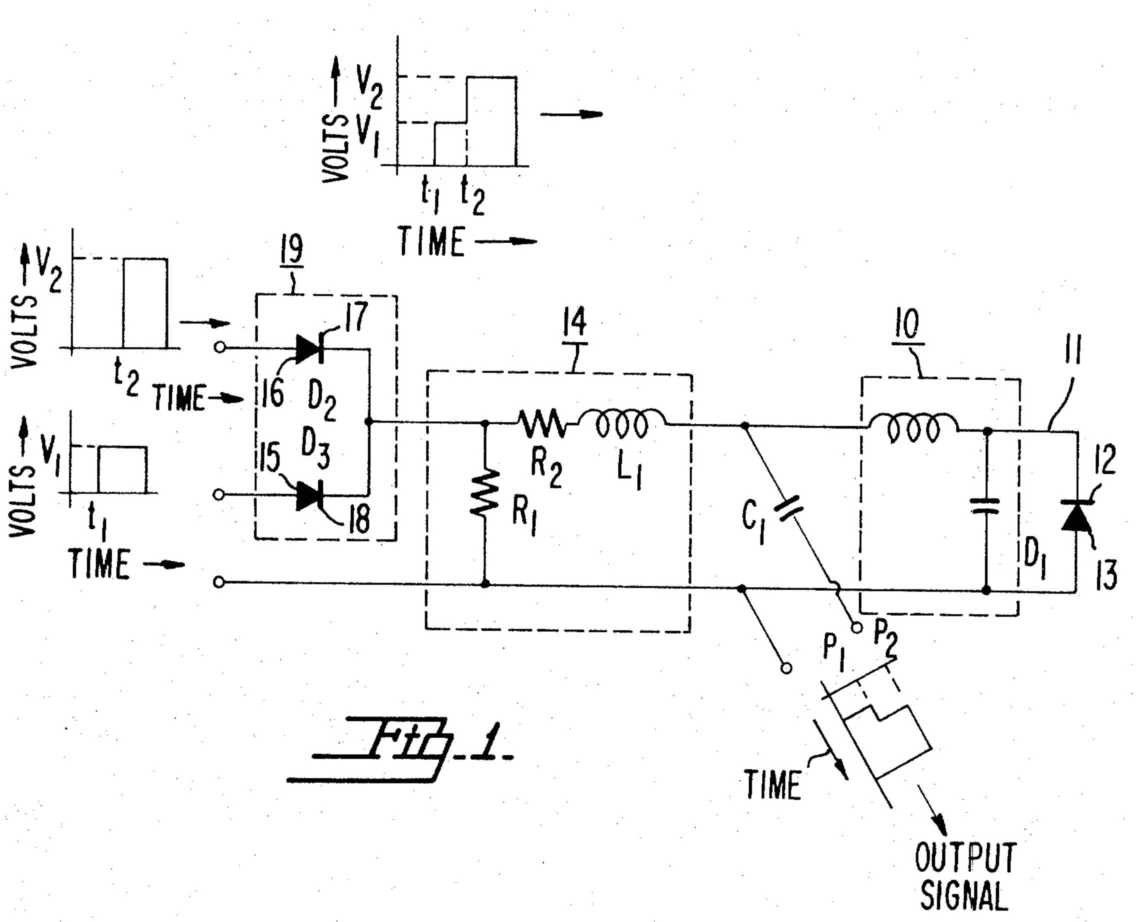
FIG. 1 is a schematic diagram of a microwave oscillator using an avalanche diode operative in the anomalous mode and biased by a direct current double pulse signal.

The necessary fast rise time of the displacement current can be achieved by utilizing the high frequency signals created by ionization at low currents. The high frequency signals trigger the avalanche diode into a high efficiency mode of operation, the anomalous mode. The operating frequency of an anomalous mode avalanche diode oscillator is related to the ratio of the velocity of the carriers in the plasma to the depletion layer width and the design of the complementary microwave circuitry. The complementary microwave circuitry is designed to present a reactive termination to the high frequency signals generated by diode $D_1$ and a substantially resistive termination at the desired frequency of oscillation. The energy reflected by the reactive termination presented by the complementary microwave circuitry is used to sustain the anomalous mode of operation. One possible microave circuit satisfying the boundary conditions required for operating an avalanche diode in the anomalous mode is provided by a low pass filter 10. The low pass filter 10 is designed to have a cutoff frequency at the desired frequency of oscillation and to match the complex impedance of the diode, $D_1$, to a load impedance, not shown. The electrical length of transmission line 11 between the avalanche diode $D_1$ and the low pass filter 10 is optimized to provide maximum operating efficiency and is substantially $\lambda/2$, where $\lambda$ is the wavelength at the desired frequency of oscillation. However, the application of a direct current (D.C.) reverse bias signal comprising a single voltage pulse exceeding a predetermined threshold level, does not immediately trigger the avalanche diode into oscillations at the desired frequency. There is a period of oscillator instability. This instability is referred to as starting jitter. The period of instability increases when the magnitude of the initial bias current through the diode, $D_1$, is at a relatively high level. The starting jitter can occasionally be reduced by empirically tuning the complementary microwave circuitry. This solution restricts the possible tuning range and operation of the microwave oscillator.

The starting jitter of the avalanche diode oscillator can be minimized by coupling a double pulse bias signal across the terminals 12, 13 of diode $D_1$. The double pulse bias signal includes a first D.C. voltage pulse having a magnitude $V_1$ at time $t_1$ and a second D.C. voltage pulse having a larger magnitude $V_2$ at a later time $t_2$. The double pulse signal is applied to the terminals 12, 13 of diode $D_1$ via a bias circuit 14 designed to appear as an open circuit or high impedance at the signal frequencies generated by diode $D_1$. The bias circuit 14 is also designed to present the proper D.C. impedance for maximum oscillator operating efficiency. The bias circuit 14 is coupled to the microwave circuitry at a location that minimizes the effect of the bias circuit 14 on oscillator performance. For this reason the low pass filter 10 is connected between the bias circuit 14 and the diode $D_1$. The portion of the bias circuit 14 comprising a high inductance lead, $L_1$, presents a high impedance at microwave frequencies. The D.C. impedance of the bias circuit 14 effects the operation of diode $D_1$. The D.C. impedance of the bias circuit 14 is substantially provided by the magnitude of the impedance combination of resistors $R_1$ and $R_2$. For oscillator applications, the magnitude of the bias circuit impedance is relatively high in order to limit the abrupt increase in current as diode $D_1$ reaches the threshold of oscillation. By way of example, a satisfactory D.C. bias circuit impedance for oscillator applications is provided when the magnitude of resistor $R_1$ is 50 ohms and the magnitude of resistor $R_2$ is 200 ohms. For amplifier applications, the magitude of the D.C. bias impedance may be empirically determined for maximum operating efficiency.

An example of a circuit for applying the double pulse bias signal to the terminals 12, 13 of diode $D_1$ is an OR circuit 19. A first positive D.C. voltage pulse having a magnitude $V_1$ at time $t_1$ is fed to the anode 15 of diode $D_3$. The first voltage pulse is a reverse bias signal having a magnitude, $V_1$, exceeding the breakdown voltage of diode $D_1$. A second positive D.C. voltage pulse having a relatively larger magnitude than $V_1$ is fed to the anode 16 of diode $D_2$ at a later time $t_2$. The first D.C. voltage pulse overlaps the second D.C. voltage pulse so that the two pulses are simultaneously fed to the diodes $D_2$ and $D_3$ at time $t_2$. The diodes $D_2$ and $D_3$ are unidirectional, and only conduct when a positive potential difference exists between their anode 15, 16 and cathode 17, 18 terminals. The magnitude, $V_1$, of the first relatively low voltage pulse is sufficient to trigger diode $D_1$ into generating energy in the anomalous mode of operation. The magnitude of the initial bias current through $D_1$ is proportional to the first D.C. bias voltage pulse and is relatively low. Therefore, the period of oscillator instability is substantially reduced. The magnitude, $V_2$, of the second relatively higher voltage pulse provides a negative potential difference between the anode 15 and cathode 18 of diode $D_3$. Therefore, diode $D_3$ becomes nonconducting during the time period of the second voltage pulse. The second voltage pulse continues the anomalous mode of diode, $D_1$, operation without adversely increasing the jitter time of the output signal and increases the power level of the output signal from $P_1$ to $P_2$. The magnitude of the blocking capacitor $C_1$ is selected to transmit, with little or no attenuation, the desired high frequency output signal generated by diode $D_1$ to a terminating load impedance not shown. The blocking capacitor $C_1$ also prevents the D.C. double pulse bias signal from being transmitted to the terminating load impedance, not shown.

Figure 2:
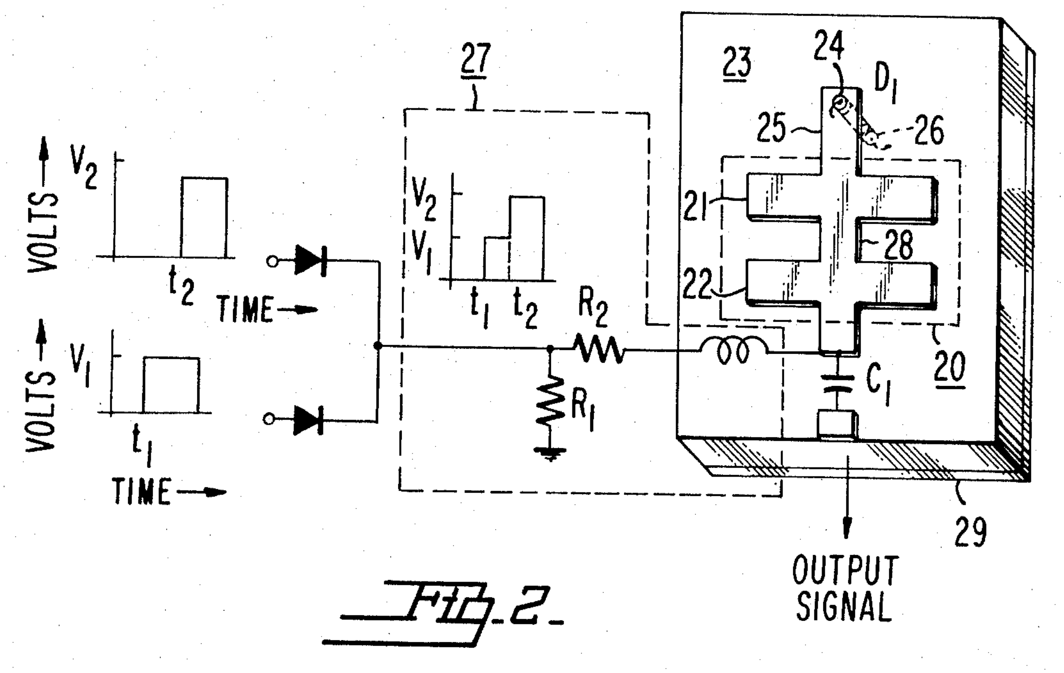
FIG. 2 is a top view if a microstrip transmission line microwave oscillator using the principles of the present invention.

Referring to FIG. 2, there is shown the top view of a microstrip transmission line oscillator including an avalanche diode, $D_1$, operative in the anomalous mode. The oscillator is designed to operate at 1.05 GHz. A microstrip transmission line low pass filter 20 is formed by a combination of several strip-like conductors 21, 22 and 28 on the top surface of a dielectric substrate 23. The dielectric constant of the dielectric substrate 23 is 2.3. The thickness of the dielectric substrate 23 is .031 inch. The bottom surface of the dielectric substrate 23 is metal clad 29 to form the ground planar conductor for the microstrip transmission line low pass filter 20. The conductive strip-like elements 21, 22 and 28 of the low pass filter 20 are designed so that the low pass filter 20 matches the complex impedance of diode $D_1$ to a terminating load impedance, not shown. The cathode 24 of diode $D_1$ is separated from the low pass filter 20 by a microstrip transmission line 25 having an electrical length of $\lambda/2$, where $\lambda$ is the wavelength at the desired frequency of oscillation. The anode 26 of diode $D_1$ is connected to the ground planar conductor 29, the actual connection not shown in the view of FIG. 1.

A bias circuit 27 similar to that shown in FIG. 1 feeds the double pulse bias signal to the cathode 24 of a 0.020 inch diameter silicon avalanche diode, $D_1$, having a breakdown voltage of 140 volts. The magnitude, $V_1$, of the first relatively low D.C. voltage pulse, is varied until the bias current through diode $D_1$ is 2 amperes. A bias current of this magnitude causes diode, $D_1$, to generate 10 watts of power at the desired frequency of oscillation. The magnitude, $V_2$, of the second relatively high D.C. voltage pulse is varied until the bias current through diode $D_1$ is increased to 4 amperes. An increase in bias current from 2 amperes to 4 amperes causes an increase in the power level of the output signal from 10 watts to 125 watts. The jitter time of the oscillator output signal is 100 nanoseconds when a single pulse bias signal, providing the same 4 ampere current through diode $D_1$, is fed to the oscillator circuit. The jitter time of the oscillator output signal is reduced to 10 nanoseconds when the double pulse bias signal is fed to the same oscillator circuit.

While a particular microstrip transmission line oscillator using an avalanche diode operative in the anomalous mode is shown, the invention directed to a reduction in oscillator jitter time by reverse biasing the avalanche diode with a double pulse bias signal exceeding the diode breakdown voltage can be used in the manner taught with other types of microwave transmission lines and circuit configurations. Waveguide, coaxial and strip-line transmission line oscillator circuits using an avalanche diode operative in the anomalous mode may be used in practicing the invention.

What is claimed is:

1. A microwave oscillator comprising:

a two terminal, negative resistance active device capable of generating signal energy in response to a direct current bias signal having a magnitude exceeding a predetermined threshold value, a microwave circuit including said device arranged to operate as a resistive termination for said signal energy at a given frequency and a reactive termination for said signal energy at all other frequencies, means for applying to said circuit and said device a double pulse bias signal including a first pulse portion having a magnitude exceeding said predetermined threshold value at a first time to trigger said device into generating said signal energy followed by a second pulse portion at a second time having a magnitude exceeding the magnitude of said first pulse portion to continue the generation of said signal energy by said device but at an increased output power.

2. A microwave oscillator in accordance with claim 1, in which said microwave circuit is a microstrip transmission line circuit formed by a strip-like conductor on one surface of a dielectric substrate and a ground planar conductor on the opposite surface of said dielectric substrate, one of said device terminals being coupled to said strip-like conductor with the other device terminal being coupled to said ground planar conductor, the complex impedance of said device coupled to said microstrip transmission line being matched to the impedance of a terminating load at said given frequency by a low pass filter connected between said device and said terminating load, said low pass filter being a reactive termination for said signals at all other frequencies.

3. A microwave oscillator in accordance with claim 1, in which said means for applying said bias signal includes a bias circuit having an output end coupled to said microwave circuit, said bias circuit being designed to present a high impedance at microwave frequencies and a desired D.C. impedance for optimum signal generation by said device.

4. A microwave oscillator in accordance with claim 3, including means responsive to a first and a second pulse input to provide said double pulse bias signal at an input end of said bias circuit.

5. A microwave oscillator in accordance with claim 4, in which said responsive means includes first and second two terminal diodes having first terminals of like polarity connected to said input end of said bias circuit, said first pulse input being fed to the second terminal of said first diode and said second pulse input being fed to the second terminal of said second diode.

6. A microwave oscillator comprising:

a two terminal avalanche diode included in a microwave circuit designed to promote the anomalous mode of diode operation in response to a double pulse direct current bias signal comprising a first direct current pulse portion having a magnitude exceeding a predetermined threshold value to trigger said diode into generating signal energy followed by a second direct current pulse portion having a magnitude exceeding said first pulse portion's magnitude whereupon said oscillator continues to transmit said energy at an increased power output, means including a bias circuit for feeding first said first pulse portion at a first time and thereafter said second pulse portion at a later time to said microwave circuit, said bias circuit presenting a high impedance at microwave frequencies and a desired D.C. impedance for optimum diode performance, and means coupled to said oscillator between said bias circuit and said microwave circuit for deriving said energy from said oscillator.

* * * * *

UNITED STATES PATENT OFFICE
CERTIFICATE OF CORRECTION

Patent No. 3,753,153 Dated August 14, 1973

Inventor(s) Shing-Gong Liu and John Joseph Risko

It is certified that error appears in the above-identified patent and that said Letters Patent are hereby corrected as shown below:

On the title page the inventor's name should be --John Joseph Risko--.

Signed and sealed this 20th day of November 1973.

(SEAL)
Attest:

EDWARD M.FLETCHER,JR.
Attesting Officer

RENE D. TEGTMEYER
Acting Commissioner of Patents

ORM PO-1050 (10-69)
30 6|72

USCOMM-DC 60376-P69
☆ U.S. GOVERNMENT PRINTING OFFICE : 1969 O—366-334